(12) United States Patent
Peng

(10) Patent No.: US 11,874,999 B2
(45) Date of Patent: Jan. 16, 2024

(54) DISPLAY PANEL WITH UNDER-SCREEN CAMERA AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Simin Peng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 786 days.

(21) Appl. No.: 16/966,031

(22) PCT Filed: Jun. 19, 2020

(86) PCT No.: PCT/CN2020/097067
§ 371 (c)(1),
(2) Date: Jul. 30, 2020

(87) PCT Pub. No.: WO2021/227197
PCT Pub. Date: Nov. 18, 2021

(65) Prior Publication Data
US 2023/0152927 A1    May 18, 2023

(30) Foreign Application Priority Data

May 13, 2020 (CN) .......................... 202010401572.6

(51) Int. Cl.
*G06F 3/042* (2006.01)
*H10K 59/40* (2023.01)
(Continued)

(52) U.S. Cl.
CPC .......... *G06F 3/0425* (2013.01); *H10K 59/40* (2023.02); *H10K 59/879* (2023.02); *G06F 2203/04103* (2013.01); *H10K 59/12* (2023.02)

(58) Field of Classification Search
CPC ........ G06F 3/0425; G06F 2203/04103; H10K 59/40; H10K 59/879; H10K 59/12
See application file for complete search history.

(56) References Cited

U.S. PATENT DOCUMENTS

2012/0223873 A1   9/2012  Ohta
2015/0014660 A1*  1/2015  Lee .................... H10K 50/854
                                                    257/40
(Continued)

FOREIGN PATENT DOCUMENTS

CN        102832227 A    12/2012
CN        104103673 A    10/2014
(Continued)

*Primary Examiner* — Afroza Chowdhury
(74) *Attorney, Agent, or Firm* — PV IP PC; Wei Te Chung; Zhigang Ma

(57) ABSTRACT

The present application provides a display panel with an under-screen camera and a method of manufacturing the same. The touch panel in the present application includes a sensing electrode and a driving electrode insulated from each other, wherein the sensing electrode and/or the driving electrode includes a lens-shaped touch point array made of a transparent material, material of the touch point array includes a transparent silver nano-wire conductor, and a transparency of the silver nano-wire conductor is greater than 91%, which can be used as a light adjustment layer, to increase the light output effect of the under-screen display area and reduce a difference in contrast between the under-screen display area and the normal display area.

18 Claims, 5 Drawing Sheets

(51) Int. Cl.
  *H10K 59/80* (2023.01)
  *H10K 59/12* (2023.01)

(56) References Cited

U.S. PATENT DOCUMENTS

| | | | |
|---|---|---|---|
| 2015/0080051 A1* | 3/2015 | Yamazaki | H04M 1/22 455/556.1 |
| 2017/0270342 A1 | 9/2017 | He et al. | |
| 2019/0393286 A1 | 12/2019 | Ding et al. | |

FOREIGN PATENT DOCUMENTS

| | | | |
|---|---|---|---|
| CN | 105185811 | A | 12/2015 |
| CN | 106816460 | A | 6/2017 |
| CN | 106971173 | A | 7/2017 |
| CN | 107329614 | A | 11/2017 |
| CN | 107731992 | A | 2/2018 |
| CN | 208819534 | U | 5/2019 |
| CN | 110534664 | A | 12/2019 |
| CN | 110600504 | A | 12/2019 |
| CN | 110767831 | A | 2/2020 |
| CN | 110783486 | A | 2/2020 |
| CN | 210467844 | U | 5/2020 |
| JP | 2007207656 | A | 8/2007 |
| TW | 201039304 | A | 11/2010 |

\* cited by examiner preparing the display panel, wherein the display panel comprises at least one transparent region for receiving external light; ⸺S101

⇩ inkjet-printing a transparent conductive solution made of silver nano-wires onto a surface of the display panel, curing and drying the transparent conductive solution by ultraviolet to form a sensing electrode, and depositing a dielectric layer on the surface of the display panel by a physical deposition method, wherein the dielectric layer covers the sensing electrode; ⸺S102

⇩ inkjet-printing the transparent conductive solution made of silver nano-wires onto a surface of the dielectric layer, curing and drying the transparent conductive solution by the ultraviolet to form a driving electrode, and depositing an insulating layer on the surface of the display panel by the physical deposition method, wherein the insulating layer covers the driving electrode. ⸺S103

FIG. 5

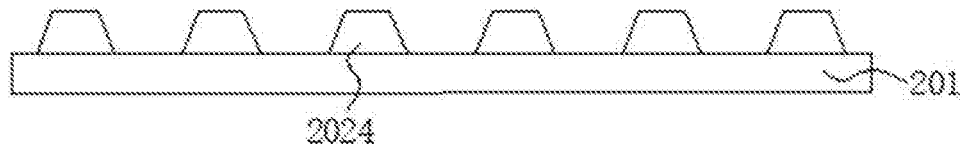

FIG. 6

DISPLAY PANEL WITH UNDER-SCREEN CAMERA AND MANUFACTURING METHOD THEREOF

BACKGROUND OF INVENTION

Field of Invention

The present application relates to a field of display technology, in particular to a display panel with an under-screen camera and a manufacturing method thereof.

Description of Prior Art

With the development of the mobile phone industry, an under-screen camera has gradually become a development trend. The under-screen camera brings better visual enjoyment and full-screen display without interference.

At present, the under-screen camera of the display panel refers to a type of display screen whose position of the camera can display. It mainly uses self-illumination of an OLED screen and can be made transparent, such that imaging is achieved through a gap between pixels of the AMOLED screen. In a front camera area, the display panel is a small transparent screen, wherein when not taking pictures, it can display an image of the screen normally, while when taking pictures, it becomes a transparent film. The current mainstream technology is to reduce the loss caused by external light passing through the area by reducing a number of pixels in the camera area, so as to improve sharpness of camera imaging. As shown in FIGS. 1 and 2, a full-screen in the prior art includes a normal display area 101 and an under-screen display area 102, wherein a density of pixel units 1011 in the normal display area 101 is greater than a density of pixel units 1021 in the under-screen display area 102, and since the number of pixel units 1021 in the under-screen display area 102 is reduced, a difference between light output effect of the under-screen display area 102 and light output effect of the normal display area 101 is resulted, which reduces the user's experience.

In summary, there is a need to design a display panel with an under-screen camera and a manufacturing method thereof to solve the technical problem in the prior art that the light output effect of the under-screen display area is different from the normal display area, which reduces the user's experience.

SUMMARY OF INVENTION

The present application provides a display panel and a display device, which can solve the technical problem in the prior art that the light output effect of the under-screen display area is different from the normal display area, which reduces the user's experience.

In order to solve the above problem, the technical solutions provided by the present application are as follows:

The present application provides a display panel with an under-screen camera, which includes a display panel and a touch panel disposed on the display panel, wherein the display panel includes at least one transparent region for receiving external light, and the touch panel includes a sensing electrode and a driving electrode insulated from each other; and wherein the sensing electrode and/or the driving electrode includes a lens-shaped touch point array made of a transparent material, and the touch point array is aligned with sub-pixels of the display panel.

According to a preferred embodiment of the present application, the lens-shaped touch point array is located at least in the transparent region.

According to a preferred embodiment of the present application, material of the touch point array includes a transparent silver nano-wire conductor, and a transparency of the silver nano-wire conductor is greater than 91%.

According to a preferred embodiment of the present application, the sensing electrode includes an array of first micro-lenses distributed in an array, and the driving electrode includes an array of second micro-lenses distributed in an array; the array of the first micro-lenses is aligned with the array of the second micro-lenses; and each of the first micro-lenses and the second micro-lenses has a semi-elliptical shape or a semi-spherical shape, and an included angle to horizontal of the semi-spherical shape near its centerline position is less than an included angle to horizontal of the semi-spherical shape away from the centerline position.

According to a preferred embodiment of the present application, a dielectric layer is further provided between the first micro-lenses and the second micro-lenses, an insulating layer is further disposed on a surface of the dielectric layer, and the insulating layer covers the second micro-lenses.

According to a preferred embodiment of the present application, material of each of the dielectric layer and the insulating layer includes one or more of acrylamide-based polymers, hexamethyldiethyl ethers, polyacrylates, polycarbonates, polystyrenes, silicon nitride, and silicon oxide.

According to a preferred embodiment of the present application, a refractive index of the first micro-lenses is less than a refractive index of the dielectric layer, and a refractive index of the second micro-lenses is greater than a refractive index of the insulating layer.

According to a preferred embodiment of the present application, the first micro-lenses and the second micro-lenses corresponding to each other are located in a light-exiting direction of a same one of the sub-pixels, the first micro-lenses cover the sub-pixels, and the second micro-lenses cover the first micro-lenses.

According to a preferred embodiment of the present application, the second micro-lenses and the first micro-lenses in the light-exiting direction of the same one of the sub-pixels have a same shape, and a contour area of the second micro-lenses is larger than a contour area of the first micro-lenses, or a contour of the second micro-lenses coincides with a contour of the first micro-lenses.

According to a preferred embodiment of the present application, the display panel is a liquid crystal display panel, an OLED display panel, or a mini-OLED display panel.

The present application also provides a display panel with an under-screen camera, which includes a display panel and a touch panel disposed on the display panel, wherein the display panel includes at least one transparent region for receiving external light, and the touch panel includes a sensing electrode and a driving electrode insulated from each other; wherein the sensing electrode and/or the driving electrode includes a lens-shaped touch point array made of a transparent material, and the touch point array is aligned with sub-pixels of the display panel; and wherein material of the touch point array includes a transparent silver nano-wire conductor, and a transparency of the silver nano-wire conductor is greater than 91%.

According to a preferred embodiment of the present application, the lens-shaped array of touch points is located at least in the transparent region.

According to a preferred embodiment of the present application, the sensing electrode includes an array of first micro-lenses distributed in an array, and the driving electrode includes an array of second micro-lenses distributed in an array; the array of the first micro-lenses is aligned with the array of the second micro-lenses; and each of the first micro-lenses and the second micro-lenses has a semi-elliptical shape or a semi-spherical shape, and an included angle to horizontal of the semi-spherical shape near its centerline position is less than an included angle to horizontal of the semi-spherical shape away from the centerline position.

According to a preferred embodiment of the present application, a dielectric layer is further provided between the first micro-lenses and the second micro-lenses, an insulating layer is further disposed on a surface of the dielectric layer, and the insulating layer covers the second micro-lenses.

According to a preferred embodiment of the present application, material of each of the dielectric layer and the insulating layer includes one or more of acrylamide-based polymers, hexamethyldiethyl ethers, polyacrylates, polycarbonates, polystyrenes, silicon nitride, and silicon oxide.

According to a preferred embodiment of the present application, a refractive index of the first micro-lenses is less than a refractive index of the dielectric layer, and a refractive index of the second micro-lenses is greater than a refractive index of the insulating layer.

According to a preferred embodiment of the present application, the first micro-lenses and the second micro-lenses corresponding to each other are located in a light-exiting direction of a same one of the sub-pixels, the first micro-lenses cover the sub-pixels, and the second micro-lenses cover the first micro-lenses.

According to a preferred embodiment of the present application, the second micro-lenses and the first micro-lenses in the light-exiting direction of the same one of the sub-pixels have a same shape, and a contour area of the second micro-lenses is larger than a contour area of the first micro-lenses, or a contour of the second micro-lenses coincides with a contour of the first micro-lenses.

According to a preferred embodiment of the present application, the display panel is a liquid crystal display panel, an OLED display panel, or a mini-OLED display panel.

According to the above-mentioned under-screen camera display panel, the present application also provides a method of manufacturing a display panel with an under-screen camera, including:

S101. preparing the display panel, wherein the display panel includes at least one transparent region for receiving external light;

S102. inkjet-printing a transparent conductive solution made of silver nano-wires onto a surface of the display panel, curing and drying the transparent conductive solution by ultraviolet to form a sensing electrode, and depositing a dielectric layer on the surface of the display panel using a physical deposition method, wherein the dielectric layer covers the sensing electrode; and S103. inkjet-printing a transparent conductive solution made of silver nano-wires onto a surface of the dielectric layer, curing and drying the transparent conductive solution by ultraviolet to form a driving electrode, and depositing an insulating layer on the surface of the display panel using a physical deposition method, wherein the insulating layer covers the driving electrode.

Beneficial effect of the present application: The present application provides a display panel with an under-screen camera and a manufacturing method thereof. In the present application, the display panel includes a display panel and a touch panel disposed on the display panel, wherein the display panel includes at least one transparent region for receiving external light, and the touch panel includes a sensing electrode and a driving electrode insulated from each other; wherein the sensing electrode and/or the driving electrode includes a lens-shaped touch point array made of a transparent material, and the touch point array is aligned with sub-pixels of the display panel; and wherein material of the touch point array includes a transparent silver nano-wire conductor, and a transparency of the silver nano-wire conductor is greater than 91%, to replace the traditional transparent aluminum-titanium alloy conductor, such that after patterning, films with different refractive indexes can be used as a light adjustment layer, to increase the light output effect of the under-screen display area and reduce a difference in contrast between the under-screen display area and the normal display area, which enhances user's experience. In addition, the lens-like structure refracts the light exited from the display panel to opposite sides, expands the viewing angle of the exited light, and improves the display quality of the display panel.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

FIG. 5 is a schematic diagram of a manufacturing process of a display panel with an under-screen camera provided by the present application.

FIG. 6 is a schematic structural diagram of a pixel definition layer prepared in a display panel with an under-screen camera provided by the present application.

DETAILED DESCRIPTION OF PREFERRED EMBODIMENTS

Figure 1:
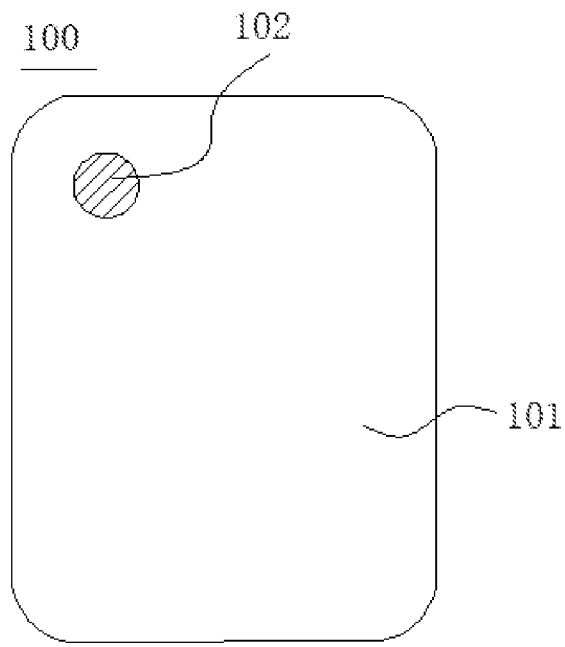
FIG. 1 is a schematic structural diagram of a display panel with an under-screen camera in the prior art.
Figure 2:
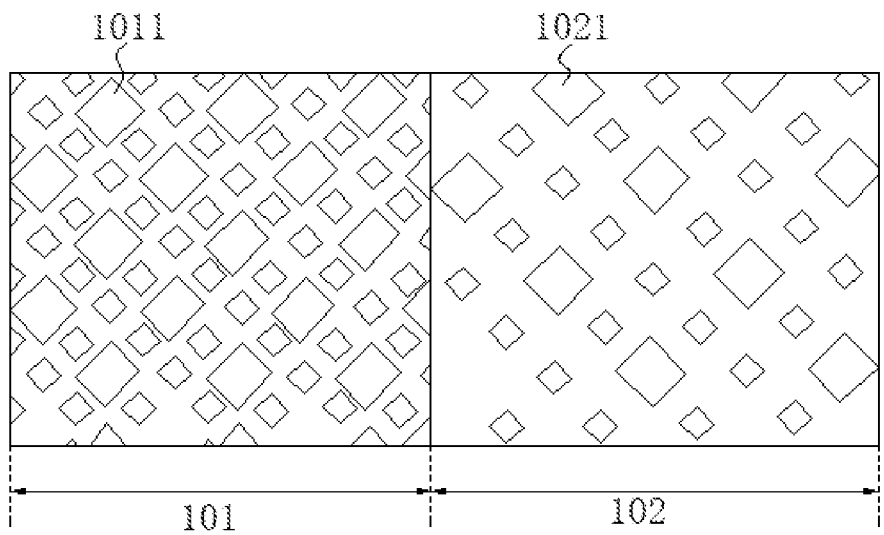
FIG. 2 is a schematic structural diagram of pixel unit distribution in a display panel with an under-screen camera in the prior art.

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the figures, structurally similar elements are denoted by the same reference numerals. The dotted line in the middle indicates that it does not exist in the structure, and only illustrates the shape and position of the structure.

The present application is directed to solve the technical problem in the prior art that the light output effect of the under-screen display area is different from the normal display area, which reduces the user's experience.

Figure 3:
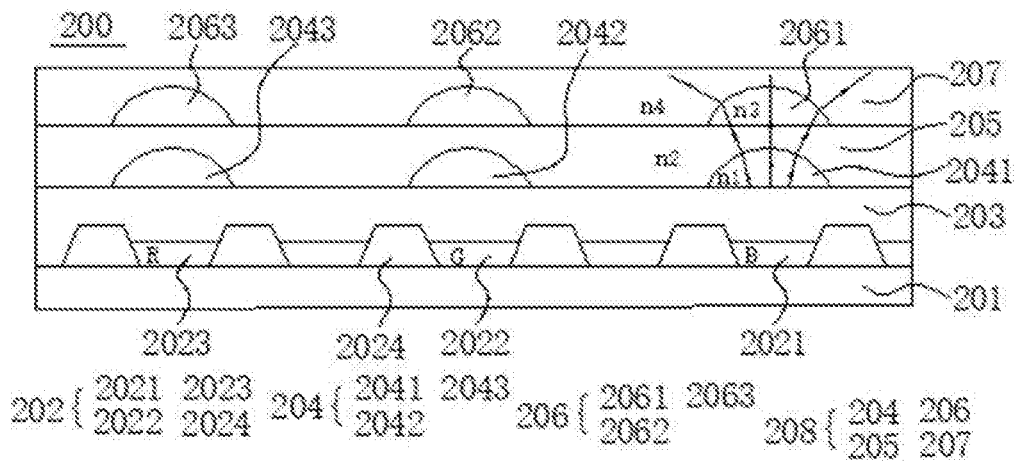
FIG. 3 is a schematic structural diagram of a display panel with an under-screen camera provided by the present application.

As shown in FIG. 3, the present application provides a display panel 200 with an under-screen camera. The display panel 200 with the under-screen camera includes a display panel and a touch panel 208 disposed on the display panel. The display panel includes at least one transparent region for receiving external light, a camera is provided below the transparent region, and a size of the camera is smaller than the size of the transparent region, a size of a pixel unit in the transparent region is smaller than a size of a pixel unit in a normal display area, and a gap between the pixel units in the transparent region is larger than a gap between the pixel units in the normal display area, which facilitates the transmission of external light to the photosensitive plate in the camera. In this embodiment, the display panel is preferably an OLED display panel. In another embodiment, the display panel may also be a liquid crystal display panel or a mini-OLED display panel.

Since the size of the pixel units in the transparent region is smaller than the size of the pixel units in the normal display area, and the gap between the pixel units in the transparent region is larger than the gap between the pixel units in the normal display area, a difference in the light-emitting effect between the under-screen display area and normal display area is resulted, which causes the technical problem of reduction in the user's experience. Therefore, the present application improves the touch panel 208 on the display panel. The touch panel 208 includes a sensing electrode 204 and a driving electrode 206 insulated from each other; wherein, each of the sensing electrode 204 and/or the driving electrode 206 includes a lens-shaped touch point array made of a transparent material, he touch point array is aligned with sub-pixels of the display panel, and the lens-shaped touch point array is at least located in the transparent region. Material of the touch point array includes a transparent silver nano-wire conductor which is formed from a transparent conductive solution of silver nano-wires cured and dried by ultraviolet light, and the silver nano-wire conductor has a transparency greater than 91% and excellent bending performance. The transparent silver nano-wire conductor has extremely high transmittance, and can replace the traditional transparent aluminum-titanium alloy conductor, such that after patterning, films with different refractive indexes can be used as a light adjustment layer, to increase the light output effect of the under-screen display area and reduce a difference in contrast between the under-screen display area and the normal display area, which enhances user's experience.

Specifically, taking an OLED display panel as an example, the OLED display panel includes an array substrate 201 and a light-emitting functional layer 202 on a surface of the array substrate 201. The array substrate 201 includes a flexible substrate and a TFT layer on a surface of the flexible substrate. The flexible substrate is preferably a glass substrate or a plastic substrate. The TFT layer includes a light-shielding layer on the flexible substrate, a buffer provided on the flexible substrate and covering the light-shielding layer, an active layer provided on the buffer layer, a first gate insulating layer provided on the active layer, a first gate provided on the first gate insulating layer, a second gate insulating layer provided on the first gate insulating layer and covering the first gate, a second gate disposed on the second gate insulating layer, a passivation layer disposed on the second gate insulating layer and covering the second gate, a source/drain disposed on the passivation layer, and a planarization layer provided on the passivation layer and covering the source/drain. The material of the planarization layer includes at least one of acrylic-based resin, epoxy resin, phenolic resin, polyamide-based resin, polyimide-based resin, and unsaturated polyester resin. The active layer includes a channel region corresponding to the first gate insulating layer and source/drain contact regions on opposite sides of the channel region respectively. The source/drain contact regions are made of a conducted metal oxide semiconductor material. Material of the channel region includes a metal oxide semiconductor material that maintains semiconductor characteristics. Source contact holes and drain contact holes corresponding to the source contact region and the drain contact region are provided on the passivation layer, the second gate insulating layer, and the first gate insulating layer, respectively, and the source and the drain are electrically connected to the source contact region and the drain contact region of the active layer through the source contact hole and the drain contact hole.

The light-emitting functional layer 202 is located on a side of the TFT layer away from the flexible substrate, and includes an anode layer and a pixel definition layer 2024 located above the anode. The pixel definition layer is separated to form a pixel opening. In the pixel opening, the light-emitting layer is tiled on the anode layer, the cathode layer is tiled on the light-emitting layer, the anode layer generates holes, and the cathode layer generates electrons. When the negatively charged electrons and the positively charged holes meat each other at the light-emitting layer, they attract each other and excite the organic material in the light-emitting layer to emit light, so as to constitute a red OLED unit 2021, a blue OLED unit 2022, and a green OLED unit 2023 which constitute three primary colors, and normal operation of the display panel is achieved. An encapsulation layer 203 is further provided on a surface of the light-emitting functional layer 202. The encapsulation layer 203 includes a first inorganic layer, an organic layer, and a second inorganic layer. Each of the first inorganic layer and the second inorganic layer includes one or more of SiNx, SiCNx, SiOx, and $SiO_2$, the organic layer includes one or more of acrylic, hexamethyldimethicone, polyacrylates, polycarbonates, polyimide, polystyrene.

The touch panel 208 includes a sensing electrode 204, a dielectric layer 205 provided on a surface of the sensing electrode 204 and covering the sensing electrode 204, a driving electrode 206 provided on a surface of the dielectric layer 205, and an insulating layer 207 provided on a surface of the driving electrode 206 and covering the driving electrode 206, wherein the sensing electrode 204 is disposed near the display panel. The sensing electrode 204 includes an array of a first micro-lens 2041, a first micro-lens 2042, and a first micro-lens 2043 distributed in an array, and the driving electrode 206 includes an array of a second micro-lens 2061, a second micro-lens 2062 and a second micro-lens 2063 distributed in an array, wherein, the first micro-lens 2041, the first micro-lens 2042 and the first micro-lens 2043 are respectively aligned with the second micro-lens 2061, the second micro-lens 2062 and the second micro-lens 2063, and first micro-lens 2041 is aligned with the red light OLED unit 2021, the first micro-lens 2042 is aligned with the blue OLED unit 2022, and the first micro-lens 2043 is aligned with the green OLED unit 2023. The corresponding ones of the first micro-lenses and the second micro-lenses are located in a light emitting direction of a same one of the sub-pixels, and the first micro-lenses can cover the sub-pixels, and the second micro-lenses can cover the first micro-lenses.

In this embodiment, structures and sizes of the first micro-lenses and the second micro-lenses are the same, or a contour of the second micro-lenses matches a contour of the first micro-lenses. Material of each of the first micro-lenses and the second micro-lenses includes transparent silver nano-wire conductor which is formed from a transparent conductive solution of silver nano-wires cured and dried by ultraviolet light. Each of the first micro-lenses and the second micro-lenses has a semi-elliptical shape or a semi-spherical shape, and an included angle to horizontal of the semi-spherical shape near its centerline position is less than an included angle to horizontal of the semi-spherical shape away from the centerline position. Material of each of the dielectric layer 206 and the insulating layer 207 includes one or more of acrylamide-based polymers, hexamethyldiethyl ethers, polyacrylates, polycarbonates, polystyrenes, silicon nitride, and silicon oxide. A refractive index of the first micro-lenses is smaller than a refractive index of the dielectric layer, and a refractive index of the second micro-lenses is greater than a refractive index of the insulating layer.

Since the refractive index of the first micro-lenses is less than the refractive index of the dielectric layer 205, and the refractive index of the second micro-lenses is greater than the refractive index of the insulating layer 207, the light emitted from the light-emitting functional layer 202 is refracted inwards at an interface between the first micro-lenses and the dielectric layer 205 Refracted upwards and inwards, resulting in more exited light incident to the second micro-lenses. After passing through the interface between the first micro-lenses and the dielectric layer 205, the light is refracted toward opposite sides when it passes through the interface between the second micro-lenses and the insulating layer 207 again, thereby realizing the expansion of a viewing angle of the light emitted from the OLED display panel.

Figure 4:
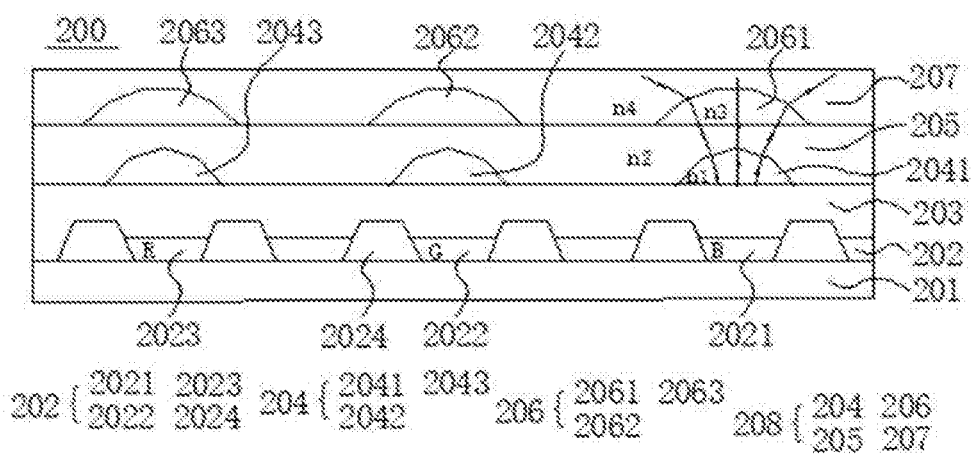
FIG. 4 is a schematic structural diagram of another display panel with an under-screen camera provided by the present application.

As shown in FIG. 4, the second micro-lenses and the first micro-lenses located in the light-exiting direction of the same one of the sub-pixels have the same shape, and the contour area of the second micro-lenses is larger than the contour area of the first micro-lenses, that is, a projection of the first micro-lenses on the dielectric layer is located in a projection of the second micro-lenses on the dielectric layer. The second micro-lenses can receive more light emitted from the lower first micro-lenses, that is, the driving electrode 206 covers the surface of the sensing electrode 204, and after the light exited from the light emitting function layer 202 is refracted at the first micro-lenses, more of it will pass through the second micro-lenses to increase intensity of the light emitted by the light-emitting functional layer 202, thereby maximizing the light output from the transparent region and increasing the light output effect of the under-screen display area and reduce a difference in contrast between the under-screen display area and the normal display area, which enhances user's experience.

According to the above-mentioned under-screen camera display panel, the present application provides a method of manufacturing an under-screen camera display panel. As shown in FIG. 5, the method includes:

S101. preparing the display panel, wherein the display panel includes at least one transparent region for receiving external light;

S102. inkjet-printing a transparent conductive solution made of silver nano-wires onto a surface of the display panel, curing and drying the transparent conductive solution by ultraviolet to form a sensing electrode, and depositing a dielectric layer on the surface of the display panel using a physical deposition method, wherein the dielectric layer covers the sensing electrode; and S103. inkjet-printing a transparent conductive solution made of silver nano-wires onto a surface of the dielectric layer, curing and drying the transparent conductive solution by ultraviolet to form a driving electrode, and depositing an insulating layer on the surface of the display panel using a physical deposition method, wherein the insulating layer covers the driving electrode.

Figure 7:
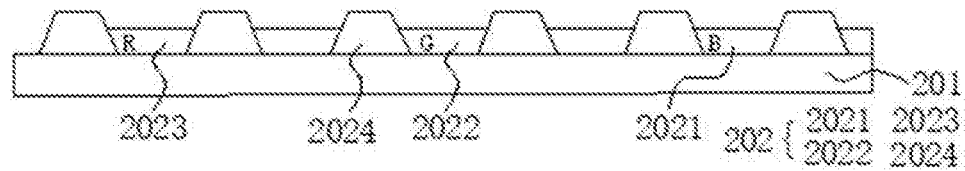
FIG. 7 is a schematic structural diagram of a light-emitting layer prepared in a display panel with an under-screen camera provided by the present application.
Figure 8:
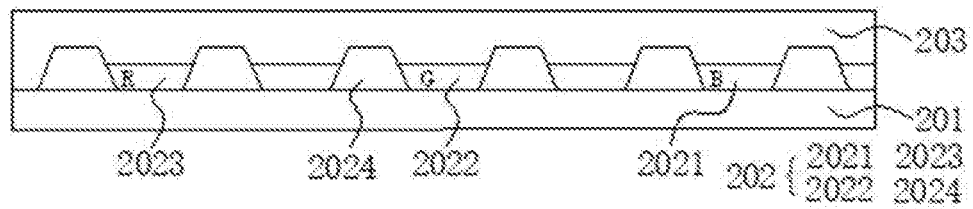
FIG. 8 is a schematic structural diagram of an encapsulation layer prepared in a display panel with an under-screen camera provided by the present application.

Specifically, the display panel with an under-screen camera in each step of the manufacturing process is shown in FIGS. 6 to 12, and the corresponding reference numerals in FIGS. 6 to 12 have the same meaning as the same reference numerals in FIG. 3. As shown in FIG. 6, a pixel definition layer 2024 is prepared on the surface of the array substrate 201 using an evaporation process and a photomask process, and the pixel definition layer 2024 is separately provided to form a pixel opening. As shown in FIG. 7, an anode layer, a light-emitting layer, and a cathode layer are deposited in the pixel opening using a physical vapor deposition process to generate a red OLED unit 2021, a blue OLED unit 2022, and a green OLED unit 2023, which constitute three primary colors, and the preparation of the light-emitting functional layer 202 in the OLED display panel is completed. As shown in FIG. 8, a first inorganic layer, an organic layer, and a second inorganic layer are laminated on a surface of the light-emitting functional layer 202 to form the encapsulation layer 203. The materials of the first inorganic layer and the second inorganic layer are inorganic functional materials for increasing the water blocking function, which are preferably one or more of SiNx, SiCNx, SiOx, etc., and material of the organic layer preferably includes one or more of polyacrylates, polycarbonates, polystyrene, etc. for covering the inorganic layer.

Figure 9:
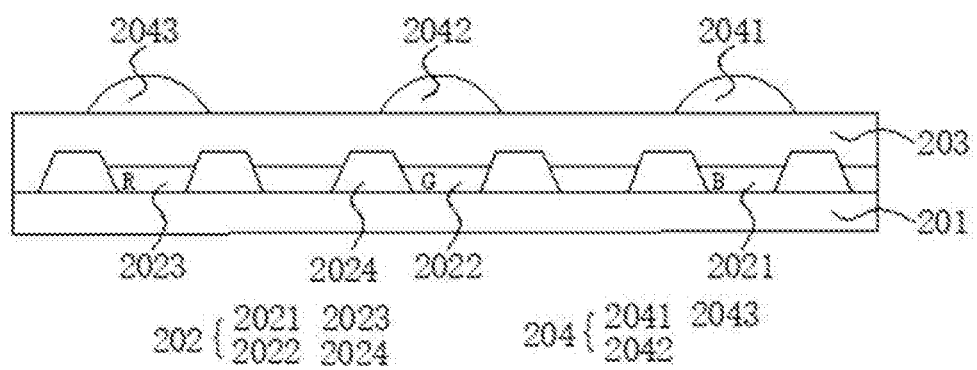
FIG. 9 is a schematic structural diagram of a sensing electrode prepared in a display panel with an under-screen camera provided by the present application.

As shown in FIG. 9, the solvent is completely drained on a surface of the encapsulation layer 203, a transparent conductive solution made of silver nano-wire is sprayed on the surface of the encapsulation layer 203 by inkjet-printing, and UV curing is performed, followed by patterning the conductive layer by a photomask to form the sensing electrode 204, wherein the sensing electrode 204 has s a convex spherical structure having a width as a pixel width, which is used to improve a light-exiting path of the pixels.

Figure 10:
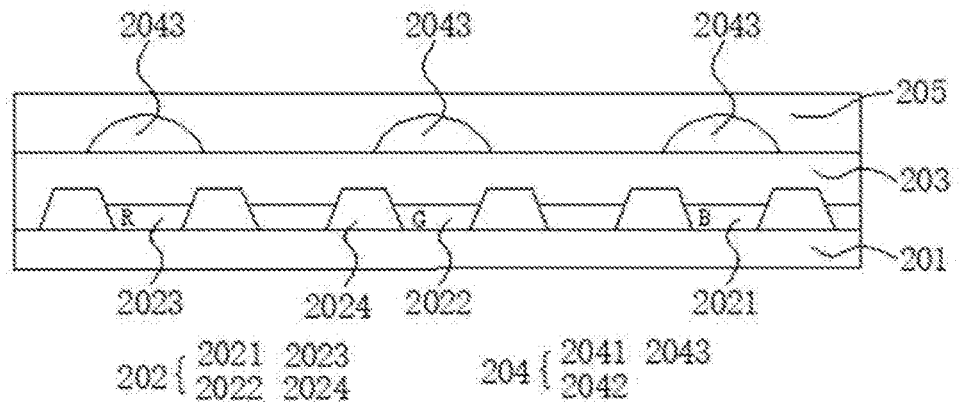
FIG. 10 is a schematic structural diagram of a dielectric layer prepared in a display panel with an under-screen camera provided by the present application.

As shown in FIG. 10, a dielectric layer 205 is prepared on the sensing electrode 204. Material of the dielectric layer 205 includes one or more of acrylamide-based polymers, hexamethyldiethyl ethers, polyacrylates, polycarbonates, polystyrenes, silicon nitride, and silicon oxide. A refractive index of the sensing electrode 204 is n1, and a refractive index of the dielectric layer 202 is n2. It is required that the refractive index of the material of the dielectric layer 205 is greater than the refractive index of the material of the sensing electrode 204, that is, n2>n1. The light exited from the light-emitting functional layer is refracted inward at an interface between the sensing electrode 204 and the dielectric layer 205, and more exited light are incident directly toward the driving electrode.

Figure 11:
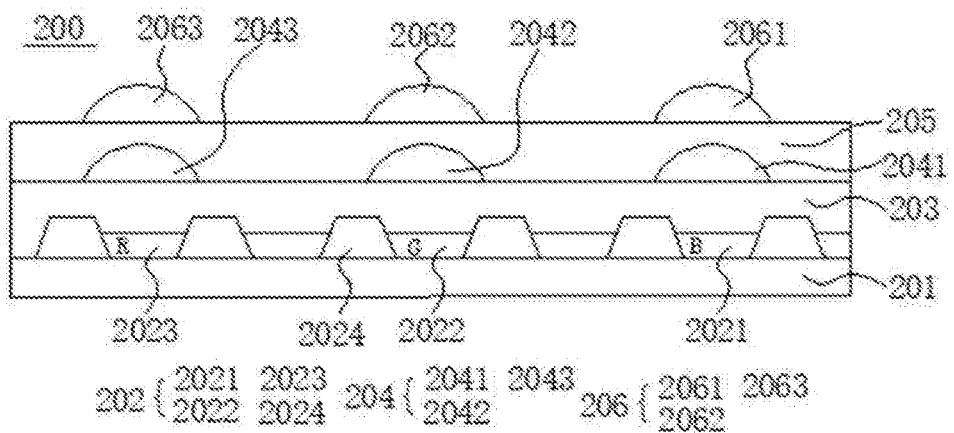
FIG. 11 is a schematic structural diagram of a driving electrode prepared in a display panel with an under-screen camera provided by the present application.
Figure 12:
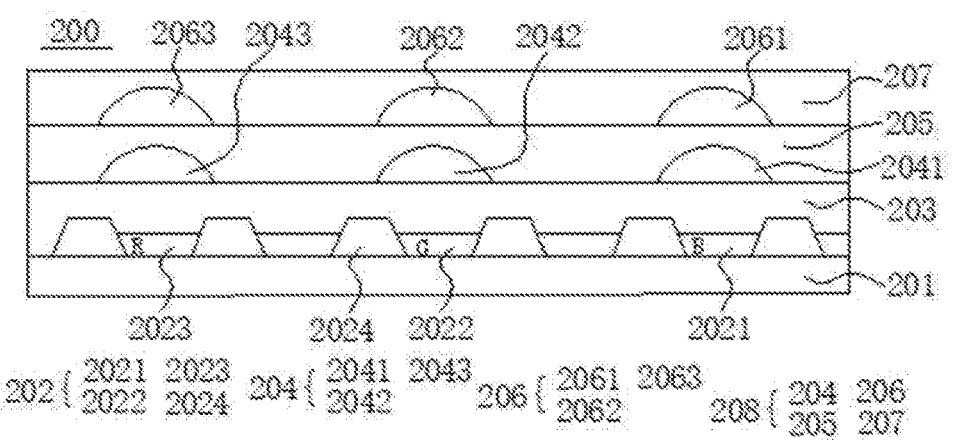
FIG. 12 is a schematic structural diagram of an insulating layer prepared in a display panel with an under-screen camera provided by the present application.

As shown in FIGS. 11 and 12, which repeat the steps in FIGS. 9 and 10 to prepare the structures of the driving electrode 206 and the insulating layer 207. The refractive index of the driving electrode 206 is n3, and the refractive index of the upper insulating layer 207 is required to be n4, that is, n4<n3. After passing through the interface between the first micro-lenses and the dielectric layer 205, the light is refracted toward opposite sides when it passes through the interface between the second micro-lenses and the insulating layer 207 again, thereby realizing the expansion of a viewing angle of the light emitted from the OLED display panel.

The present application provides a display panel with an under-screen camera and a manufacturing method thereof. In the present application, the display panel includes a display panel and a touch panel disposed on the display panel, wherein the display panel includes at least one transparent region for receiving external light, and the touch panel includes a sensing electrode and a driving electrode insulated from each other; wherein the sensing electrode and/or the driving electrode includes a lens-shaped touch point array made of a transparent material, and the touch point array is aligned with sub-pixels of the display panel; and wherein material of the touch point array includes a transparent silver nano-wire conductor, and a transparency of the silver nano-wire conductor is greater than 91%, to replace the traditional transparent aluminum-titanium alloy conductor, such that after patterning, films with different refractive indexes can be used as a light adjustment layer, to increase the light output effect of the under-screen display area and reduce a difference in contrast between the under-screen display area and the normal display area, which enhances user's experience. In addition, the lens-like structure refracts the light exited from the display panel to opposite sides, expands the viewing angle of the exited light, and improves the display quality of the display panel.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display panel with an under-screen camera, comprising a display panel and a touch panel disposed on the display panel, wherein the display panel comprises an array substrate, a plurality of sub-pixels arranged on the array substrate, and at least one transparent region, the at least one transparent region is arranged corresponding to an under-screen camera region and allows external light to pass through and arrive the under-screen camera region, the touch panel comprises a plurality of sensing electrodes and a plurality of driving electrodes, and the sensing electrodes are electrically insulated from the driving electrodes;

wherein the sensing electrodes and the driving electrodes constitute a lens-shaped touch point array made of a transparent material, the touch point array is aligned with the sub-pixels of the display panel, and the lens-shaped touch point array is located at least in the transparent region;

wherein the sensing electrodes constitute an array of first micro-lenses distributed in an array, the driving electrodes constitute an array of second micro-lenses distributed in an array, the array of the first micro-lenses is aligned with the array of the second micro-lenses, and each of the first micro-lenses and the second micro-lenses is a plano-convex lens and is convex in a direction away from the array substrate.

2. The display panel with the under-screen camera according to claim 1, wherein material of the touch point array comprises a transparent silver nano-wire conductor, and a transparency of the silver nano-wire conductor is greater than 91%.

3. The display panel with the under-screen camera according to claim 1, wherein each of the first micro-lenses and the second micro-lenses has a semi-elliptical shape or a semi-spherical shape, and an included angle to horizontal of the semi-spherical shape near its centerline position is less than an included angle to horizontal of the semi-spherical shape away from the centerline position.

4. The display panel with the under-screen camera according to claim 3, wherein a dielectric layer is further provided between the first micro-lenses and the second micro-lenses, an insulating layer is further disposed on a surface of the dielectric layer, and the insulating layer covers the second micro-lenses.

5. The display panel with the under-screen camera according to claim 3, wherein material of each of the dielectric layer and the insulating layer comprises one or more of acrylamide-based polymers, hexamethyldiethyl ethers, polyacrylates, polycarbonates, polystyrenes, silicon nitride, and silicon oxide.

6. The display panel with the under-screen camera according to claim 3, wherein a refractive index of the first micro-lenses is less than a refractive index of the dielectric layer, and a refractive index of the second micro-lenses is greater than a refractive index of the insulating layer.

7. The display panel with the under-screen camera according to claim 6, wherein each of the first micro-lenses and one of the second micro-lenses arranged corresponding to this first micro-lens are located in a light-exiting direction of a same one of the sub-pixels, an orthographic projection of each of the first micro-lenses projected on the array substrate covers an orthographic projection of each of the sub-pixels projected on the array substrate, and an orthographic projection of each of the second micro-lenses projected on the array substrate covers an orthographic projection of each of the first micro-lenses projected on the array substrate.

8. The display panel with the under-screen camera according to claim 7, wherein each of the second micro-lenses and one of the first micro-lenses arranged corresponding to this first micro-lens in the light-exiting direction of the same one of the sub-pixels have a same shape, and a contour area of the second micro-lenses is greater than a contour area of the first micro-lenses, or the contour of the second micro-lenses coincides with the contour of the first micro-lenses.

9. The display panel with the under-screen camera according to claim 1, wherein the display panel is a liquid crystal display panel, an organic light emitting-diode (OLED) display panel, or a mini-OLED display panel.

10. A display panel with an under-screen camera, comprising a display panel and a touch panel disposed on the display panel,
wherein the display panel comprises an array substrate, a plurality of sub-pixels arranged on the array substrate, and at least one transparent region, the at least one transparent region is arranged corresponding to an under-screen camera region and allows external light to pass through and arrive the under-screen camera region, the touch panel comprises a plurality of sensing electrodes and a plurality of driving electrodes, and the sensing electrodes are electrically insulated from the driving electrodes;
wherein the sensing electrodes and the driving electrodes constitute a lens-shaped touch point array made of a transparent material, the touch point array is aligned with the sub-pixels of the display panel, and the lens-shaped touch point array is located at least in the transparent region; and
wherein material of the touch point array comprises a transparent silver nano-wire conductor, and a transparency of the silver nano-wire conductor is greater than 91%;
wherein the sensing electrodes constitute an array of first micro-lenses distributed in an array, the driving electrodes constitute an array of second micro-lenses distributed in an array, the array of the first micro-lenses is aligned with the array of the second micro-lenses, and each of the first micro-lenses and the second micro-lenses is a plano-convex lens and is convex in a direction away from the array substrate.

11. The display panel with the under-screen camera according to claim 10, wherein
each of the first micro-lenses and the second micro-lenses has a semi-elliptical shape or a semi-spherical shape, and an included angle to horizontal of the semi-spherical shape near its centerline position is less than an included angle to horizontal of the semi-spherical shape away from the centerline position.

12. The display panel with the under-screen camera according to claim 11, wherein a dielectric layer is further provided between the first micro-lenses and the second micro-lenses, an insulating layer is further disposed on a surface of the dielectric layer, and the insulating layer covers the second micro-lenses.

13. The display panel with the under-screen camera according to claim 12, wherein material of each of the dielectric layer and the insulating layer comprises one or more of acrylamide-based polymers, hexamethyldiethyl ethers, polyacrylates, polycarbonates, polystyrenes, silicon nitride, and silicon oxide.

14. The display panel with the under-screen camera according to claim 12, wherein a refractive index of the first micro-lenses is less than a refractive index of the dielectric layer, and a refractive index of the second micro-lenses is greater than a refractive index of the insulating layer.

15. The display panel with the under-screen camera according to claim 14, wherein each of the first micro-lenses and one of the second micro-lenses arranged corresponding to this first micro-lens are located in a light-exiting direction of a same one of the sub-pixels, an orthographic projection of each of the first micro-lenses projected on the array substrate covers an orthographic projection of each of the sub-pixels projected on the array substrate, and an orthographic projection of each of the second micro-lenses projected on the array substrate covers an orthographic projection of each of the first micro-lenses projected on the array substrate.

16. The display panel with the under-screen camera according to claim 14, wherein each of the second micro-lenses and one of the first micro-lenses arranged corresponding to this first micro-lens in the light-exiting direction of the same one of the sub-pixels have a same shape, and a contour area of the second micro-lenses is greater than a contour area of the first micro-lenses, or the contour of the second micro-lenses coincides with the contour of the first micro-lenses.

17. The display panel with the under-screen camera according to claim 10, wherein the display panel is a liquid crystal display panel, an OLED display panel, or a mini-OLED display panel.

18. A method of manufacturing a display panel with an under-screen camera, comprising:
S101. preparing the display panel, wherein the display panel comprises at least one transparent region for receiving external light;
S102. inkjet-printing a transparent conductive solution made of silver nano-wires onto a surface of the display panel, curing and drying the transparent conductive solution by ultraviolet to form a sensing electrode, and depositing a dielectric layer on the surface of the display panel by a physical deposition method, wherein the dielectric layer covers the sensing electrode; and
S103. inkjet-printing the transparent conductive solution made of silver nano-wires onto a surface of the dielectric layer, curing and drying the transparent conductive solution by the ultraviolet to form a driving electrode, and depositing an insulating layer on the surface of the display panel by the physical deposition method, wherein the insulating layer covers the driving electrode.

* * * * *